(12) United States Patent
Sutton

(10) Patent No.: US 7,047,442 B2
(45) Date of Patent: May 16, 2006

(54) ELECTRONIC TEST PROGRAM THAT CAN DISTINGUISH RESULTS

(75) Inventor: Christopher K Sutton, Everett, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 569 days.

(21) Appl. No.: 10/128,387

(22) Filed: Apr. 23, 2002

(65) Prior Publication Data

US 2003/0200483 A1 Oct. 23, 2003

(51) Int. Cl.
*G06F 11/00* (2006.01)

(52) U.S. Cl. .......................... 714/25; 714/703; 702/90; 702/123

(58) Field of Classification Search .................. 714/25, 714/703, 57; 702/123, 90; 324/763
See application file for complete search history.

(56) References Cited

U.S. PATENT DOCUMENTS 5,963,565 A * 10/1999 Rezvani et al. ............. 714/724
6,133,727 A * 10/2000 Chun et al. ............... 324/158.1
6,319,737 B1 * 11/2001 Putnam et al. ................ 438/17

(Continued)

OTHER PUBLICATIONS

Fertitta, Kirk G., "The Role of Activex and COM in ATE", Autotestcon 1999, IEEE Systems REadiness Technology Conference, 1999, IEE San Antonio, TX, USA Aug. 30-Sep. 2, 1999, Piscataway, NJ, USA, IEEE, US, Aug. 30, 1999, pp. 35-51, XPO10356128, ISBN: 0-7803-5432-X.

(Continued)

*Primary Examiner*—Bryce P. Bonzo
*Assistant Examiner*—Marc Duncan

(57) ABSTRACT

An electronic test system that distinguishes erroneous and marginal results. The test system includes a memory and an electronic processor for controlling the execution of the test, obtaining test results and generating test results. The test results include a determination of whether the condition of the test datapoints is pass, fail, error or marginal, where pass indicates that the DUT has met a specification, fail indicates that the DUT has not met the specification, error indicates that the test system or interface to the DUT has failed, and marginal indicates that the system is marginally within specification. The test results are displayed on a graphical user interface. The test system provides the ability to control the progress of the test system based on the results. For example, the system can be programmed to stop on erroneous results, marginal results, failed results, combinations of the forgoing, or stop after each measurement. When the system stops, a drop-down window appears explaining the reason for the stoppage.

32 Claims, 7 Drawing Sheets

U.S. PATENT DOCUMENTS

| | | | |
|---|---|---|---|
| 6,453,435 | B1 | 9/2002 | Limon, Jr. et al. |
| 6,560,554 | B1* | 5/2003 | Anderson .................. 702/108 |
| 6,577,981 | B1* | 6/2003 | Grey et al. ................. 702/119 |
| 2002/0188424 | A1* | 12/2002 | Grinstein et al. ........... 702/183 |
| 2003/0018446 | A1* | 1/2003 | Makowski et al. ......... 702/123 |

OTHER PUBLICATIONS

Teststand User Manual [online], Mar. 2001, Retrieved on Nov. 7, 2003. Retrieved from the Internet: <URL:http://www.ni.com/pdf/manuals/322016b.pdf>, p. 1-1 to p. 1-2, p. 6-29, p. 10-7, figures 6-9 & 10-4, XPO02260790.

National Instruments, "TestStand—A Complete—Test Executive Environment", www.ni,com, catalog 2001, pp. 160-163.

National Instruments, "TestStand—A Complete—Test Executive Environment", www.natinst.com, Mar. 2000, pp. 55-60.

* cited by examiner

ELECTRONIC TEST PROGRAM THAT CAN DISTINGUISH RESULTS

BACKGROUND OF THE INVENTION

Complex electronic, electromechanical and mechanical products and equipment are generally tested using automated test systems. Such tests can include validation tests which run through the various operations that the device under test (DUT) is capable of and records whether each operation was performed properly; environmental tests which expose the DUT to various combinations of temperature, pressure and humidity, and records the results; production tests, etc. Generally, both the DUT and the systems providing the environmental and other constraints on the DUT are controlled electronically. In the last decade or so, computerized programs which are capable of controlling a variety of automated tests, referred to in the art as "test executive" programs, have been developed.

Test executive programs in the prior art include internal test executive programs developed by Agilent Technologies and TESTSTAND software developed by National Instruments Corporation, which is described as a ready-to-run test executive program for organizing, controlling, and executing automated prototype, validation, or production test systems. The prior art Agilent Technologies programs did not use a graphical user interface (GUI), therefore limiting the ability of the program to display large amounts of data in a simple fashion. The TESTSTAND software, while using a GUI, requires the user to scroll through multiple windows to determine the overall progress of a test.

Tests usually are defined by a set of rules or specifications to which the DUT is compared. The rules or specifications generally comprise various inputs defined by electrical and mechanical parameters applied to the DUT, such as voltage, current, specified manipulations of controls and device parts, as well as environmental parameters under which the test is conducted, such as temperature, humidity, pressure, and the time period over which a parameter is applied. Each test will include many combinations of the parameters applied to each element of the DUT, and often will be repeated many times. Each combination of parameters will define a measurement that results in one or more datapoints, which are recorded and compared to numerical or Boolean limits defining the specifications. Thus, as equipment and products become more complex, electronic test programs have become very long and complex, often requiring several days, or even a week or more to run a complete test.

Likewise, setting up connections to the DUT is also a long and complex process. There are many things that can fail or go wrong during the set-up process, both with the set-up of the connections to the DUT and with the test system itself. Failures occurring in the connections to the DUT and in the test system itself may also occur during the testing process. Failures occurring either during the set-up process or during the testing process will affect the datapoints that are recorded during the testing process. In particular, failures will affect the value of the datapoints produced by the test. If the effect on a datapoint is significant enough, comparison of that datapoint to the numerical or Boolean limits defining the specifications may show that datapoint to be outside of the limits defined by the specifications. Without knowing that a failure has caused the datapoint to fall outside of the limits defined by a specification, the datapoint will be erroneously treated as having failed to meet the specification. Likewise, if a failure causes the value of a datapoint to move within the limits defined by a specification, the datapoint will be falsely treated as having passed the specification. Such failures of the system, as opposed to failures of the DUT, are referred to herein as "erroneous results".

Prior art test systems are not able to alert the user to erroneous results. Such prior art systems are also unable to alert the user to a significant number of marginal results, which is indicative of an inferior device. Instead, in the case of such a failure, the test progresses and the values of the datapoints are recorded, whether or not they have been affected by the failure. When those datapoints are compared to the numerical or Boolean limits defining the specifications, the results of the comparison are likewise affected by the failure. In later reviewing the results of the test, it may be possible for a user to determine that an erroneous result has occurred through abnormalities in the results of the test. However, in actual practice, the user almost always will permit the test to run unattended for hours, overnight, or for days, while other work is attended to. Because of the length and complexity of the tests, and the inferiority of the display technology of prior art test systems, when the user returns to check on the test, it takes considerable time and effort to review the results to determine the progress and results of the test and to further ascertain whether a system failure has occurred and has affected the results of the test. In many cases, it often happens that the time necessary to do a thorough analysis of the results is not available as the test is being run and the results are only reviewed after the test has been completed. As a result, much test time is wasted when test results are reviewed after a test is completed, and it is found that certain elements of the test were improperly set up, that a failure of the test system occurred during the test, or the interface with the DUT was faulty in some respect that was not recognized during the test.

The above problems lead to inefficiencies that add to the cost of products and slow product development. Thus, a test executive system that overcomes these problems would be highly desirable.

SUMMARY OF THE INVENTION

The present invention solves the above and other problems in the prior art by providing a test executive system that distinguishes erroneous results. The invention also provides a test executive system that distinguishes marginal results. The system preferably also distinguishes failed and passed results. Preferably, the invention alerts the user to such results during the measurement of any single datapoint. In the preferred embodiment, the system may be programmed to stop on erroneous results, marginal results, failed results, combinations of the foregoing, or stop after each measurement. This programming is preferably easily done by clicking on a button that, preferably, remains visibly activated on the GUI so that the user readily can identify this programming at any time.

The system has a graphical user interface which is preferably divided into windows containing either icons for controlling the test procedure or windows for displaying the results as text, tables, graphical points or graphical colored bars, and other GUI elements. The user can control the test procedure by accessing the program features represented by the icons and windows with a pointing device such as a mouse, a keyboard, a trackball, a touch pad, a roller ball and a joystick.

In addition to the system stopping, if so programmed, the user is preferably alerted in several ways to erroneous results. Preferably, the erroneous result is displayed in several ways on a graphical user interface (GUI), such as the term "error" appearing in tables, a running graphical display called a "progress window", as well as immediately recognizable icons in a tree structure.

The invention provides a method of operating a test executive system for controlling tests on a device under test (DUT) that is separate and distinct from the test executive system, the method comprising: performing a measurement to obtain a test result; determining whether the test result is an erroneous result reflecting at least one of: a failure of the test executive system or other test equipment, faulty set up of the DUT, and a failure of the interface between the test executive system or other test equipment and the DUT, as opposed to failures of the DUT itself; and displaying an error indication correlated to the measurement if the test result is determined to be an erroneous result. Preferably, the determining comprises determining whether the test result contains a value, and the displaying comprises displaying the error indication if the test result does not contain a value. Preferably, the determining comprises determining whether the test result comprises a predetermined format, and the displaying comprises displaying the error indication if the test result does not comprise the predetermined format. Preferably, the predetermined format comprises a format selected from the group consisting of: a numerical format, an alphanumeric format, and a string of numerical values and alphanumeric codes in a predetermined arrangement. Preferably, the method further comprises storing a test specification, and the determining comprises determining whether the test result is within the test specification. Preferably, the test specification comprises one or more limits. Preferably, the one or more limits are selected from the group consisting of: error limits, specification limits, and marginal limits. Preferably, the error limits comprise an upper error limit and a lower error limit, and the displaying comprises displaying the error indication if the test result is not within the upper error limit and the lower error limit. Preferably, the specification limits comprise an upper specification limit and a lower specification limit, and the displaying comprises displaying a failed indication if the test result is not within the upper specification limit and the lower specification limit. Preferably, the marginal limits comprise an upper marginal limit and a lower marginal limit, and the displaying comprises displaying a marginal indication if the test result is not within the upper marginal limit and the lower marginal limit. Preferably, the determining further comprises determining a pass result if the test result is within the upper marginal limit and the lower marginal limit, and the test result comprises the predetermined format. Preferably, the displaying comprises displaying the error indication in a spreadsheet element corresponding to the measurement. Preferably, the displaying comprises displaying the error indication as an icon in a hierarchical tree in a progress window. Preferably, the displaying comprises displaying information relating to the error. Preferably, the displaying comprises displaying the information in a dialog box. Preferably, the method further comprises: stopping the test after the act of determining; receiving an input selected from the group consisting of: abort the test, restart the test, restart the measurement, continue the test, skip the measurement, skip the test; and executing the input. Preferably, the displaying comprises displaying information selected from the group consisting of: the results of the measurement on which the test program stopped, the reason for stopping the test, and the time at which the test stopped.

In another aspect, the invention provides a test executive system for controlling electronic tests on a device under test (DUT) that is separate and distinct from the test executive system, the test executive system comprising: a memory for storing a test and test results including erroneous results reflecting at least one of: a failure of the test executive system or other test equipment, faulty set up of the DUT, and a failure of the interface between the test executive system or other test equipment and the DUT, as opposed to failures of the DUT itself; an electronic processor communicating with the memory for controlling the execution of the test, generating the test results, and determining whether a test result is erroneous; a graphical user interface output device communicating with the electronic processor for displaying information, preferably wherein the memory also stores a DUT specification and a plurality of measurement datapoints, and wherein the test results also include failed results reflecting a comparison of the measurement datapoints with the test specification. Preferably, the test result comprises an error result if, for a test datapoint, the result of the comparison contains no value, does not have a predetermined format, or is not within error limits. Preferably, the information further includes a graphic element enabling a user to select among two or more of the following options: perform the test without stopping; stop the test on erroneous results; stop the test on failed results; stop the test on marginal results; stop the test on failed results or erroneous results; stop the test on marginal results, failed results or erroneous results; stop the test after each measurement. Preferably, the information further includes a stop test indicator indicating which of the options has been selected. Preferably, the error indicator comprises a graphical element selected from the group consisting of: a spreadsheet element corresponding to the measurement; an icon in a hierarchical tree; an error indication in a progress window; and a dialog box.

In a further aspect, the invention provides a product that provides a test executive system for controlling tests on a device under test (DUT) that is separate and distinct from the test executive system, the product comprising instructions for directing a processing unit to: perform a measurement to obtain a test result; determine whether the test result is an erroneous result reflecting at least one of: a failure of the test executive system or other test equipment, faulty set up of the DUT, and a failure of the interface between the test executive system or other test equipment and the DUT, as opposed to failures of the DUT itself; display an error indication correlated to the measurement if the result is determined to be an erroneous result; and a media readable by the processing unit that stores the instructions. Preferably, the product includes instructions to: determine if the test result is a marginal result; and display a marginal result indication correlated to the measurement if the result is marginal.

In still another aspect, the invention provides a method of operating a test executive system for controlling tests on a device under test (DUT) that is separate and distinct from the test executive system, the method comprising: performing a measurement to obtain a test result; determining whether the test result is a marginal result; and displaying a marginal result indication correlated to the measurement if the result is marginal.

In yet another aspect, the invention provides a product that provides a test executive system for controlling tests on a device under test (DUT) that is separate and distinct from the test executive system, the product comprising instructions for directing a processing unit to: perform a measurement to obtain a test result; determine whether the test result is a marginal result; display a marginal result indication correlated to the measurement if the result is determined to be a marginal result; and a media readable by the processing unit that stores the instructions.

In yet a further aspect, the invention provides a test executive system for controlling electronic tests on a device under test (DUT) that is separate and distinct from the test executive system, the test executive system comprising: a memory for storing a test and test results; an electronic processor communicating with the memory for controlling the execution of the test and generating the test results; a graphical user interface device communicating with the electronic processor for displaying information, the information including a graphic element enabling a user to select among two or more of the following options: perform the test without stopping; stop the test on erroneous results; stop the test on failed results; stop the test on marginal results; stop the test on failed results or erroneous results; stop the test on marginal results, failed results or erroneous results; stop the test after each measurement. Preferably, the information further includes a stop test indicator indicating which of the options has been selected. Preferably, the information further comprises a graphical input element selected from the group consisting of: abort the test, restart the test, restart the measurement, continue the test, skip the measurement, skip the test, and executing the input; and executing the input. Preferably, the information further includes information selected from the group consisting of: the results of the measurement on which the test program has stopped; a reason for stopping a test; and the time at which a test stopped.

In yet another aspect, the invention provides a method of operating a test executive system for controlling electronic tests on a device under test (DUT) that is separate and distinct from the test executive system, the method comprising: performing a test to obtain a test result; displaying information including a graphic element enabling a user to select among two or more of the following options: perform the test without stopping; stop the test on erroneous results; stop the test on failed results; stop the test on marginal results; stop the test on failed results or erroneous results; stop the test on marginal results, failed results or erroneous results; stop the test after each measurement; receiving a selection of one of the options; and stopping the test as directed in the selected option. Preferably, the method further comprises: after the act of stopping the test, displaying a graphical element enabling a user to select a command from the group consisting of: abort the test, restart the test, restart the measurement, continue the test, skip the measurement, and skip the test; and executing the command. Preferably, the method further comprises, after the act of stopping the test, displaying information selected from the group consisting of: the results of the measurement on which the test program stopped, the reason for stopping the test, and the time at which the test stopped.

The invention also provides a product that provides a test executive system for controlling tests on a device under test (DUT) that is separate and distinct from the test executive system, the product comprising instructions for directing a processing unit to: perform a test to obtain a test result; display information including a graphic element enabling a user to select among two or more of the following options: perform the test without stopping; stop the test on erroneous results; stop the test on failed results; stop the test on marginal results; stop the test on failed results or erroneous results; stop the test on marginal results, failed results or erroneous results; stop the test after each measurement; receive a selection of one of the options; stop the test as directed in the selected option; and a media readable by the processing unit that stores the instructions.

The test executive system according to the invention not only is more efficient than previous systems, but also frees up the user to attend to other tasks during testing, since the user can program the system to stop at points at which the test may need to be adjusted. Numerous other features, objects and advantages of the invention will become apparent from the following description when read in conjunction with the accompanying drawings.

DETAILED DESCRIPTION OF THE PREFERRED EMBODIMENT

The present invention relates to an electronic test system that is able to distinguish erroneous and marginal test results from passed and failed test results, and to display alerts to the user when those results occur. In particular, the present invention is further capable of providing alerts that correspond to the test results such that a user may be alerted to a failure or marginal result in the device under test (DUT), which may be indicative of an inferior device, and such that the user may also be alerted to erroneous results in the device being tested, which may be indicative of a failure or mistake in the testing system rather than an inferior device.

Figure 1:
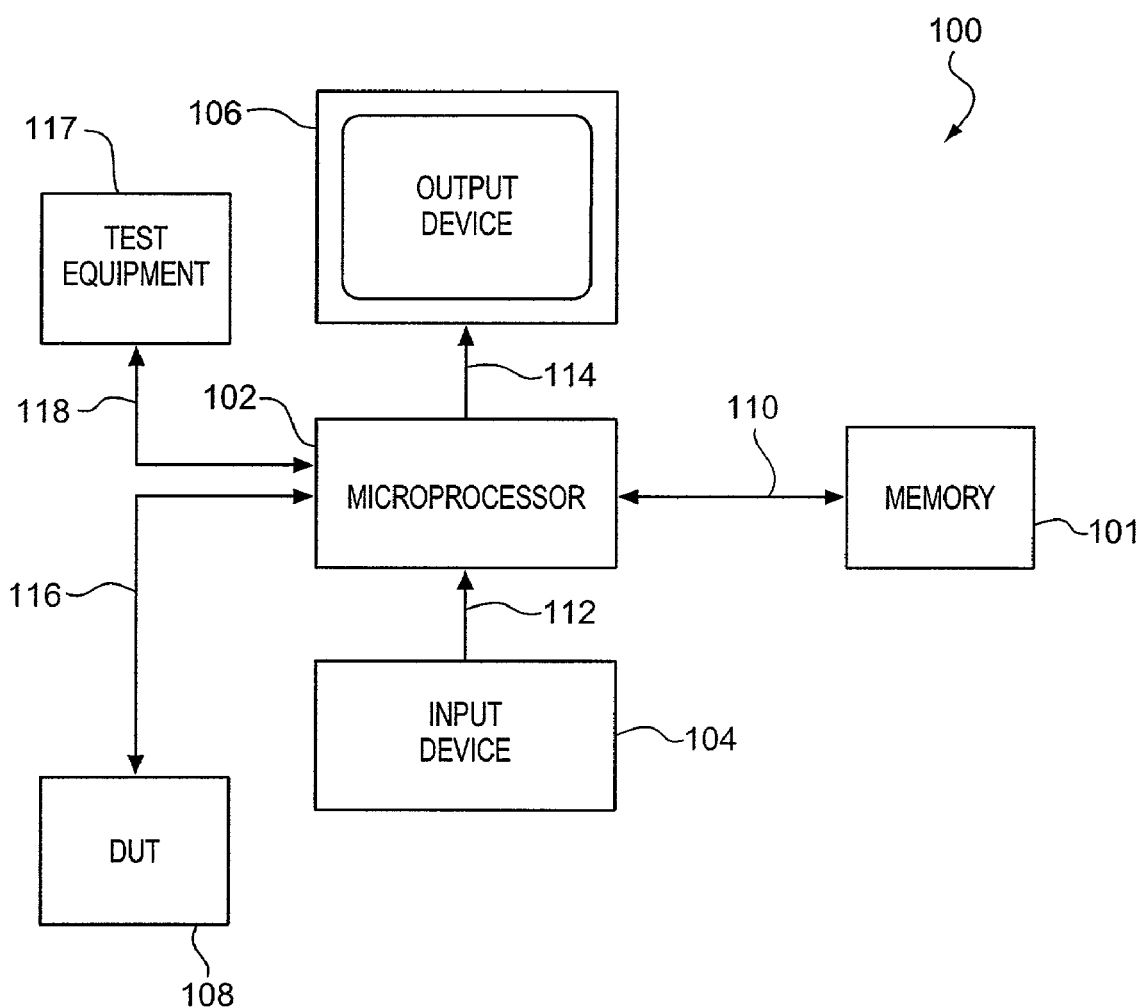
FIG. 1 is a block diagram showing the principal hardware components of the preferred embodiment of the present invention connected to a device under test and test equipment.

Referring to FIG. 1, in the embodiment of the test system shown in the figures, the test system preferably comprises a computer system 100, including software. Computer system 100 includes a memory 101, a microprocessor 102, an input device 104, and an output device 106. Memory 101 communicates with microprocessor 102 via electrical line 110. Input device 104 communicates with microprocessor 102 through electrical line 112. Microprocessor 102 outputs the data through output device 106 via electrical line 114. In another embodiment, the test system can take the form of software stored in memory 101 and run or executed by processor 102.

The user interacts with the test system through input device 104 such as, but not limited to, a keyboard, a mouse, a track ball, a touch pad, a joystick, or other computer input device known in the art. Input device 104 allows moving a cursor or a pointer on output device 106 (a display system such as a Cathode Ray Tube monitor or a Liquid Crystal Display). The results of the test are displayed on output device 106. The test is controlled by processor 102, which communicates the instructions of the test program to the product under test or device under test (D UT) 108 via electrical line 116. Processor 102 controls the test equipment 117 via electrical line 118. The test results are processed by processor 102 and stored in memory 101 to be visualized by display 106. The display information contains both information as to the configuration and position of the cursor and other visual information of interest to the user such as the results of the test and how the test is progressing. DUT 108 is separate and distinct from test executive system 100. Here, "separate" means physically separate, as contained in a separate housing, and "distinct" means it is functionally independent, including in the way one software program, such as a word processor, is functionally separate from another software program, such as a CAD program.

The invention may be implemented in a variety of actual electronic devices that follow the general form outlined on FIG. 1. For example, the test system may be embodied in a computer system or it may also be embodied in other hardware as a logic circuit, embodied as an electronic testing device such as, but not limited to, an electronic analyzer.

Figure 2:
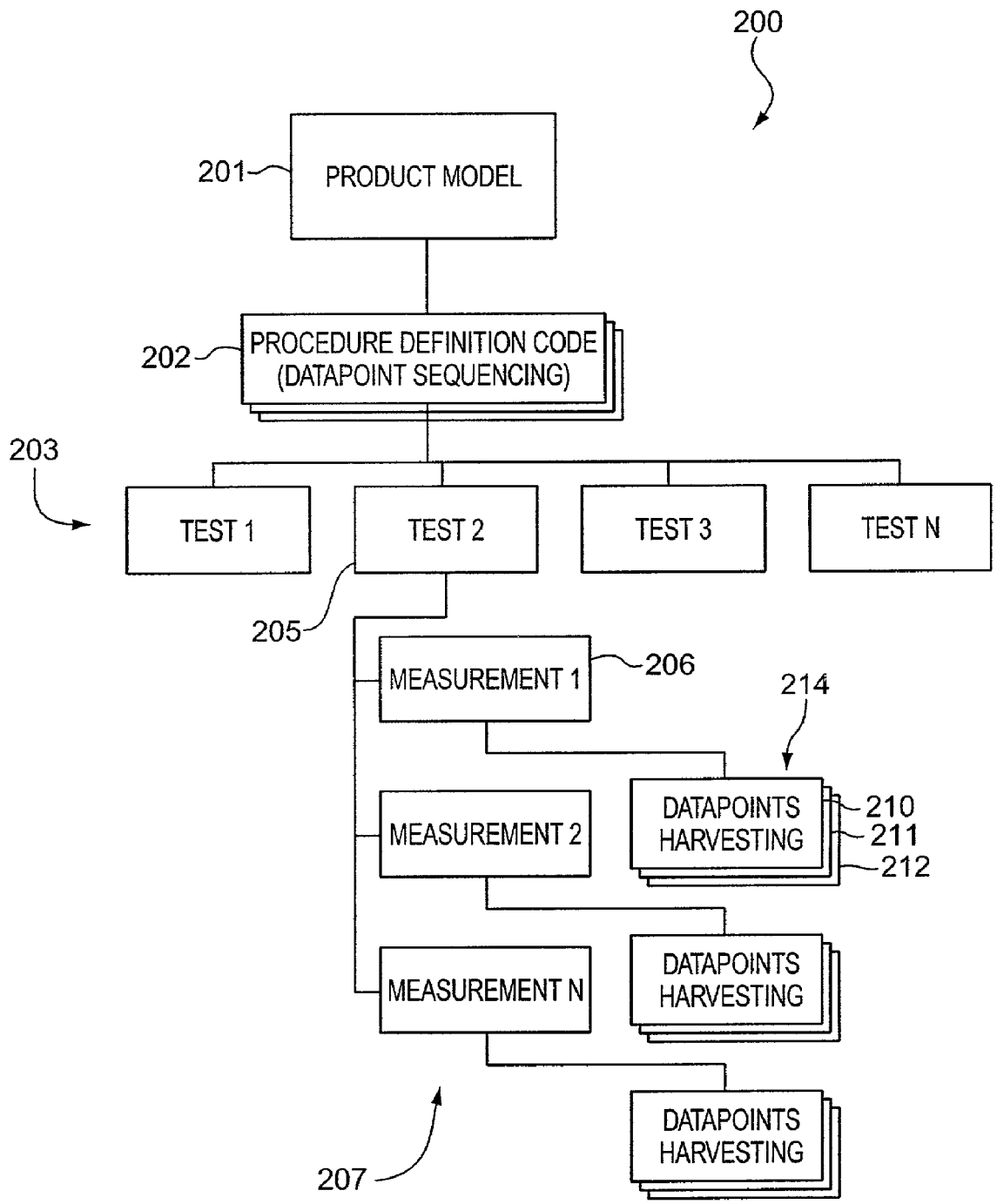
FIG. 2 is a block diagram showing the hierarchical structure of the preferred embodiment of a test program according to the invention.

To better understand the workings of the invention, it is helpful to describe the hierarchical structure of the preferred test program of the present invention, and the order in which the test is performed. Referring to FIG. 2, there is shown a block diagram 200 illustrating the hierarchical, i.e., multi-level, characteristic of the test program. The first level 201 corresponds to the product model, a file the test developer creates to test a family of specific device model numbers. It contains test procedures and inputs.

The next level 202 corresponds to the procedure itself. A procedure is an ordered list, sequence, or script of tests to be run. Several procedures may exist, which is represented in FIG. 2 by a deck of cards 202, each representing a different procedure. Each procedure includes a plurality of tests, i.e., test 1, test 2, test 3 . . . test N, as shown at 203. Each test includes a plurality of measurements. This is illustrated in FIG. 2 for test 2 shown at 205. As shown, test 205 includes measurements 207, i.e., measurement 1, measurement 2, . . . , measurement N. Each measurement includes one or more datapoints, represented as a deck of cards 210, 211, 212, associated with each measurement. A procedure is defined by writing a program or a code to build a structure of software objects. In one embodiment, the software objects are Component Object Model (COM) objects. COM is a language independent component architecture, not a programming language. It is meant to be a general purpose, object-oriented means to encapsulate commonly used functions and services. See Newton's Telecom Dictionary by Harry Newton, Publishers Group West, page 197.

A test 205 is a group of measurements 207 in a procedure 202 that share the same test algorithm or the same test software code. Some examples of tests include amplitude accuracy test, test of harmonic distortion, etc. The test program repeatedly calls a test for each measurement and datapoint.

A measurement, such as measurement 206, is a configuration or a set up for a test. Each measurement, in measurements 207, within a test 205 can have different setups or configuration parameters. Tests are parameter driven and the parameters are inputs at the measurement level. Measurements are elements such as range in volts, frequency in kilohertz or harmonic (an integer number). The test procedure 202 views the measurements 207 as data to be passed from the procedure to a test. A measurement is also a phase of test execution. During the measurement phase of test execution, the measurement is started but data is not collected. This allows for multiple devices under test (DUTs) to be configured and triggered together.

A datapoint such as 210, 211, 212 is a subset of a measurement, such as 206, containing additional parameters that select a result when one measurement generates multiple results. Some examples of multiple datapoints for a measurement are the minimum and maximum of a spectrum analyzer sweep or each channel of a device.

For each datapoint, such as 210, in measurement 206, a value result is extracted. The results obtained are compared to specifications. Specifications are numerical limits, string match, or Boolean pass/fail. There are three sets of limits: marginal limits, line limits and customer limits. Each limit has an upper value and a lower value.

Further details of the software according to the invention are described in pending U.S. patent application Ser. No. 09/992,224, which is hereby incorporated by reference to the same extent as though fully disclosed herein.

Figure 3:
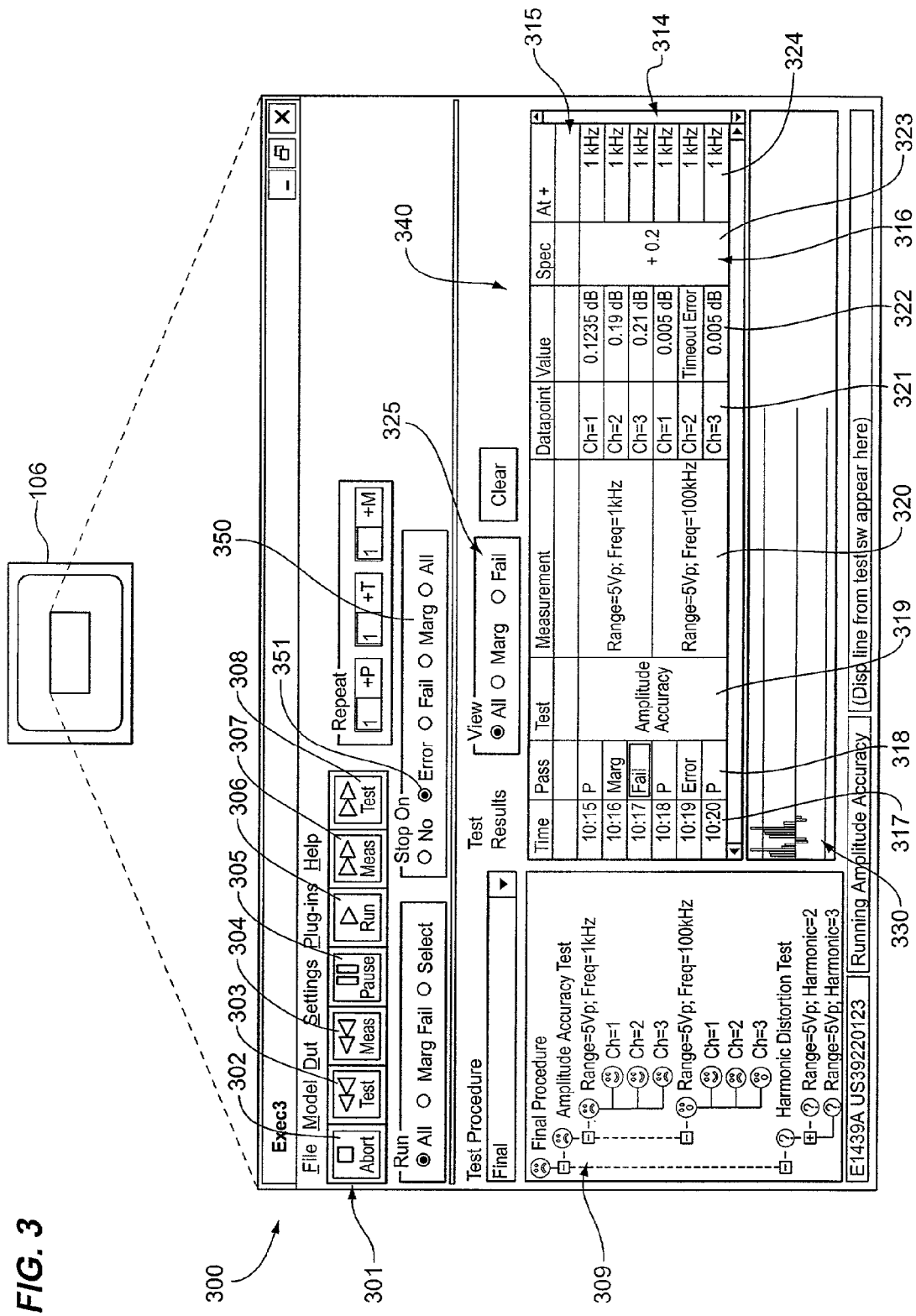
FIG. 3 shows a view of the graphical user interface of the electronic test system.

All the inputs and outputs of the electronic test system (FIG. 1) are handled preferably through a graphical user interface (GUI). FIG. 3 shows graphical user interface 300 as displayed on output device 106. The tape recorder buttons 301 on the top left are used to control the test. From left to right, recorder buttons 301 are abort 302, restart test 303, restart measurement 304, pause 305, run 306, skip measurement 307, skip test 308. The right side 314 of graphical user interface 300 shows a window 340 comprising a series of rows, such as 315, and columns, such as 316. Window 340 displays the time 317 the test is run, as well as the status of the test 318. This window also displays the test that is being carried out, such as amplitude accuracy in 319; the type of measurement, such as (range=5 Vp, Frequency=1 kHz) in 320; the datapoint or channel under test, such as (Ch=1, Ch=2, Ch=3) in 321; the value or result of the measurement, such as (0.1235 dB) in 322; the specification, such as.(0.2) in 323; and the frequency, such as (1 kHz) in 324. The test results can be sorted by clicking on the "view" buttons in window 325 above window 340. This allows either all the test results to be displayed, or permits the results to be filtered and displayed depending on their marginal or failed status.

Figure 4:
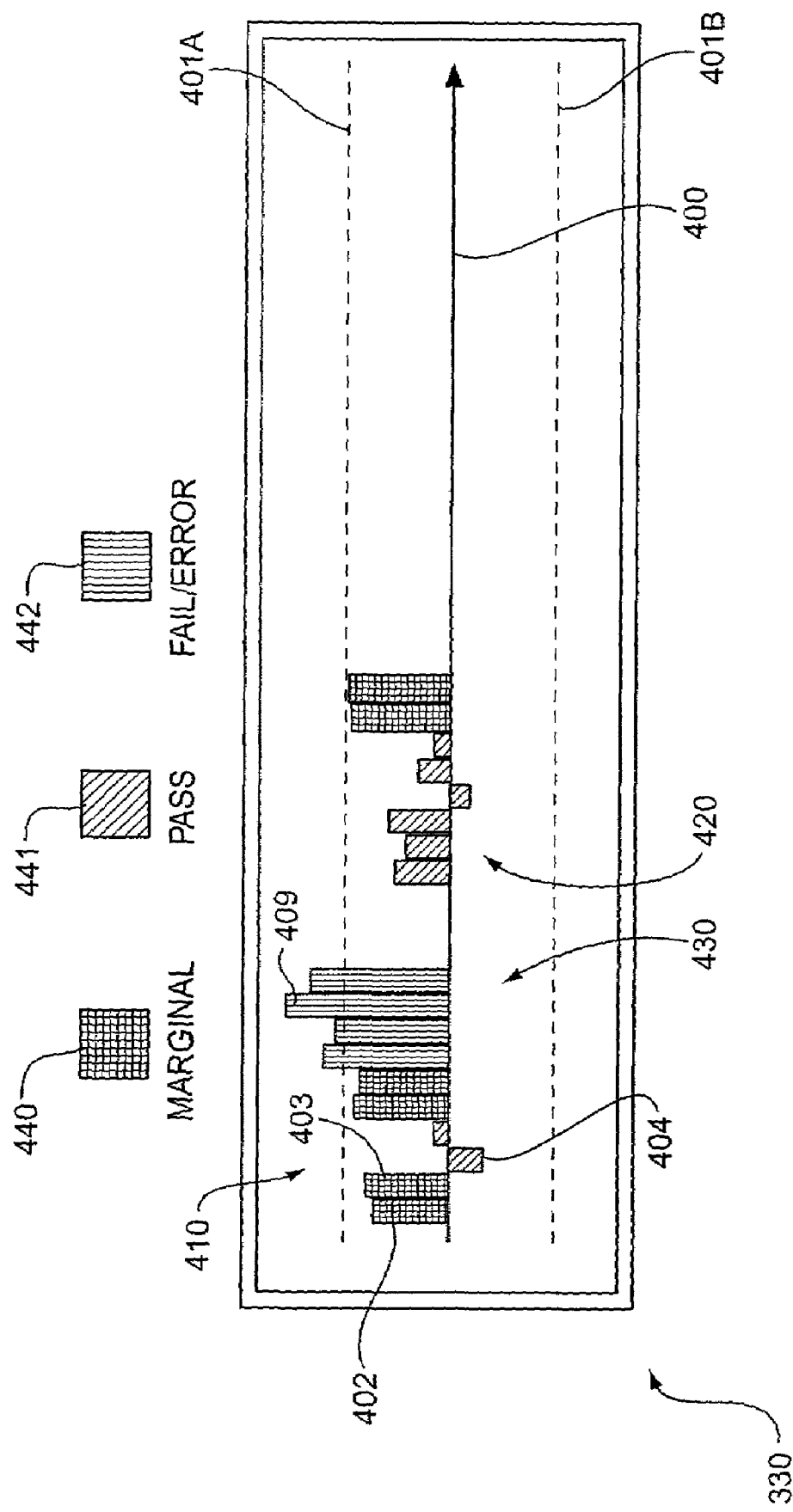
FIG. 4 shows a progress window according to the invention.

The bottom right window 330 is the progress window. The progress window indicates the progress of the test procedure. An enlarged view of progress window 330 is shown in FIG. 4. Referring now to FIG. 4, axis 400 represents the length of the entire procedure. Datapoints corresponding to the test results are preferably plotted as datapoint units 410 along a progress axis 400. Each datapoint unit 410 preferably is a single graphical element, such as 402, 403, 404, etc. Preferably, each graphical element comprises a bar. Progress window 330 also preferably includes specification limit elements. Preferably, the specification limit elements comprise dotted horizontal lines 401A and 401B, with 401A indicating the upper limit and 401B indicating the lower limit. If the bar representing the result is within specification, that is, its length is such that it is within the area defined by the specification limit lines, such as 404, the result is a "pass." If the bar representing the result is outside specification, that is, its length extends beyond the corresponding specification limit line, such as 409, the result is a "fail." If the bar representing the result is inside the specification limits, but within a predetermined range of the specification limits, that is, its length is equal to or close to the corresponding specification limit line, such as 403, the result is a "marginal." Preferably, each graphical element is also color coded to indicate pass 404, fail or error 409, or marginal 403 status. For example, the color red is chosen for fail and error, the color green for pass and the color yellow for marginal. Thus, each datapoint results in a colored vertical bar, such as 402, 403, 404, etc. In FIG. 4, graphical elements 410 are lined for color. As shown at 440, a hatched lining indicates a yellow color; as shown at 441, a diagonal lining indicates a green color; and, as shown at 442, a vertical lining indicates a red color. Though the bars are preferably color coded to indicate the status of the test measurements, the color code is not essential since the user can distinguish the status of each measurement by looking at the length of each bar relative to the specification lines. However, adding a color to the bar facilitates the determination of the status of each test result. Likewise, while the same color is used to indicate both error and fail, it will be appreciated that separate colors may be chosen for error and failure.

Figure 5:
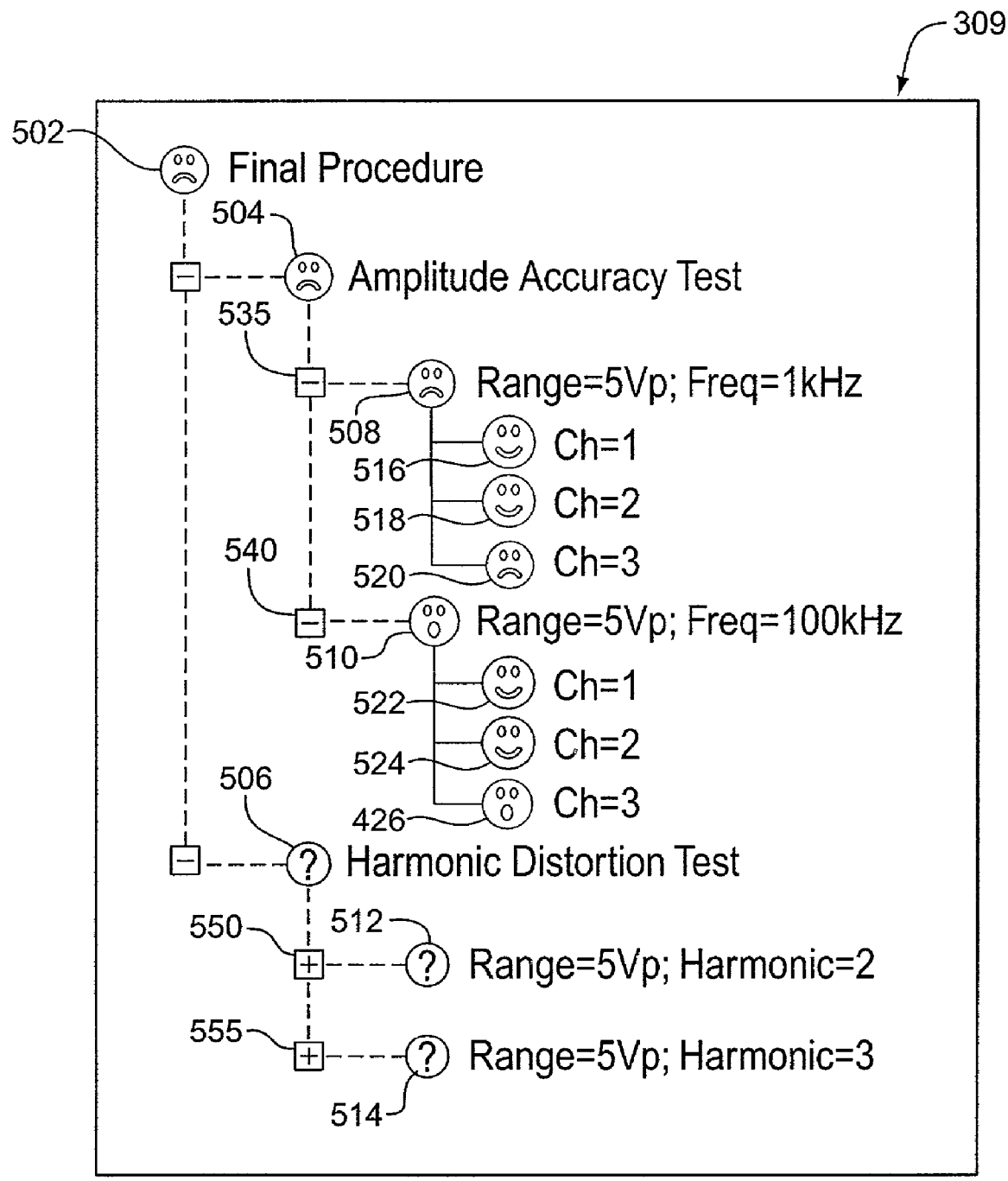
FIG. 5 shows a tree structure according to the invention.

Referring once again to FIG. 3, window 309 on the left side of GUI 300 shows the results of each test using a tree structure according to the invention. The tree structure displayed in window 309 includes a hierarchy of tests, measurements, and datapoints. An enlarged view of tree window 309 is shown in FIG. 5. The tree structure contains multiple levels with the first or highest level corresponding to the final test procedure shown with icon 502. This is considered the trunk of the tree structure. The second level in the execution of the test procedure comprises one or more tests, such as 504. In the embodiment shown, the second level includes two tests: an amplitude accuracy test shown with its corresponding result icon 504, and a harmonic distortion test shown with its corresponding result icon 506. Each test procedure in the second level gives way to the third level showing one or more types of measurements taken during the test, such as 508. The third level represents the type of measurement itself, such as (range=5 Vp, Freq=1 Khz) with its corresponding result icon 508, (range=5 Vp, Freq=100 kHz) with its corresponding result icon 510, (range=5 Vp, Harmonic=2) with its corresponding result icon 512, and (range=5 Vp, Harmonic=3) with its corresponding result icon 514. The fourth level in the execution of the test procedure represents datapoints, such as (Ch=1, Ch=2, Ch=3) with their respective result icons 516, 518 and 520, associated with the datapoints (Ch=1, Ch=2, Ch=3) being sub-levels of measurement 508, and respective result icons 522, 524, 526 associated with the (Ch=1, Ch=2, Ch=3) datapoints being sub-levels of measurement 510. The result for each level or branch in the tree structure is indicated by an easily readable icon. Preferably, a "smiling face", such as 516, is selected to indicate a "pass" result; a "sad face", such as 504, is selected to indicate a "fail" result or an "error" result; a "surprised face", such as 510, is selected to indicate a "marginal" result; and a "?" is selected to indicate a "not-yettested" result. Most preferably, each result icon is color coded to indicate the status of the result. For example, the color green is assigned to a "pass" result, the color red is assigned to a "fail" or "error" result, the color yellow is assigned to a "marginal" result, and no color is assigned to a "not-yet-tested" result. Preferably, the result for a level is determined by applying an algorithm where the least optimal result, e.g., "fail" is given precedence over optimal results, e.g., "pass".

As noted above, in addition to "pass", "fail", and "marginal" results, the test program provides for the display of "errors" in the test results. In particular, the test program of the present invention distinguishes "pass", "fail", and "marginal" results from "error" results. An "error" result is a result that is determined to have resulted from a failure or mistake in the set-up or operation of the test system as opposed to a failure of the DUT to perform within specifications when tested. In particular, for each value obtained from a test, the test system determines whether the result is a reasonable measurement. If a reasonable measurement is not detected, the test result is determined by the test program to be in "error." The range of measurements defining a reasonable measurement is established by the developer of the tests that are run by a test program of the present invention prior to commencing a test procedure. Preferably, the range of reasonable measurements is established such that measurements that result from the normal testing of a DUT are within the range of reasonable measurements, while measurements that result from failures or mistakes in the test set-up or test system are outside of the range of reasonable measurements. It will be appreciated by one of average skill in the art that the test program of the present invention may also find an error result in the event that no measurement at all is returned to the test program. One such example is where the component of the test system that is to return the measurement to the test system has failed, or where a cable connecting the test system to the DUT has become disconnected or has failed. Likewise, it will be appreciated that the test program of the present invention may also find an error result if the measurement returned to the test program is not in the format that is expected by the test program. For example, if the format to be processed by the test program is numeric, but the measurement returned is alphanumeric, an error is indicated. Such a case may occur, for example, if a test device is malfunctioning or the wrong test device has been attached to the test system. It will also be appreciated that an error may be returned when the computer software program that comprises the test program of the present invention performs an illegal operation; for example, when the program is called upon to return a measurement that is arrived at by dividing by zero.

The measurements obtained by the test program in the case of such a failure, mistake, or illegal operation will be determined by the test program to be an "error" rather than a "fail." An error of any nature indicates that a measurement is not valid. Like other results, error results are displayed on the GUI 300 as an "error". In addition, an error message may be displayed stating the nature or source of the error. However, unlike other results, error results are excluded from the data obtained by the tests. It will be appreciated by one of ordinary skill in the art that excluding results that are determined to be in error from other legitimate results provides the benefit of preventing such error results from unnecessarily corrupting the statistical distribution of any analysis of the legitimate results of the tests.

Referring again to FIG. 3, the present invention further includes a "stop on" feature. The stop on feature is accessed by a user through the Stop On icon 350 on the GUI 300. Stop On icon 350 allows the test program to be stopped upon encountering any or all of a fail, errors, or marginal test result. As shown in FIG. 3, Stop Icon 350 preferably includes radio buttons for "No", "Error", "Fail", "Marg", or "All". For example, by clicking on the "No" radio button, the test program will be instructed to proceed to run all scheduled tests in sequence regardless of the results encountered. By clicking on the "Error" radio button, the test program will be instructed to stop testing upon encountering a test that results in an error. By clicking on the "Fail" radio button, the test program will be instructed to stop testing upon encountering a test that results in a failure. By clicking on the "Marg" radio button, the test program will be instructed to stop testing upon encountering a test that results in a marginal result. By clicking on the "All" radio button, the test program will be instructed to stop after each measurement, regardless of whether program has encountered a pass, error, fail, or marginal test result. While the foregoing are the preferred "stop on" commands, other such commands may be incorporated into the system, such as "stop said test on failed results or erroneous results" and "stop said test on marginal results, failed results or erroneous results". It should also be noted that the "stop on" icon contains a stop test indicator 351 indicating which "stop on" option has been selected. This indicator remains visible on interface 300 at all times so that the user can quickly determine how the system has been programmed.

It will be appreciated by one of ordinary skill in the art that Stop On icon 350 may also take the form of a drop down menu in which each radio button in the foregoing description takes the form of a choice on the drop down menu.

Figure 6:
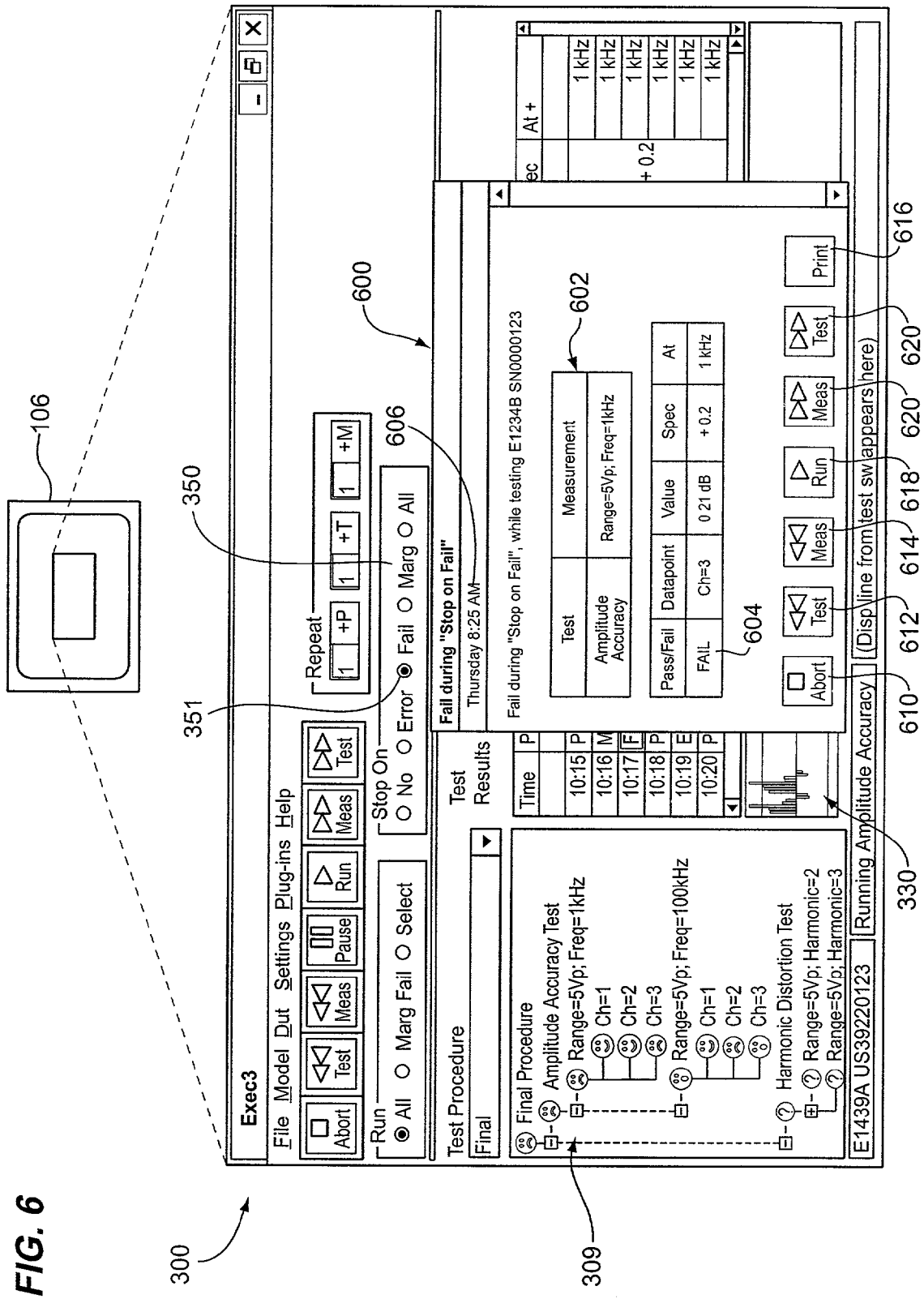
FIG. 6 shows a stop dialog box according to the invention.

When any of the "stop on" conditions are met, the test program is stopped and a dialog box is displayed of the GUI 300. Referring to FIG. 6, a dialog box 600 is shown on GUI 300. Dialog box 600 shown in FIG. 6 has resulted from a command to stop on any failed results. Dialog box 600 displays the results of the test on which the test program has stopped 602, the reason for stopping the test 604, and the time 606 at which the test has stopped. Dialog box 600 also preferably contains tape recorder buttons. The tape recorder buttons include the following buttons: a button 610 which, when selected, causes the system to abort the entire test procedure; a button 612 which, when selected, causes the system to restart the test; a button 614 which, when selected, causes the system to restart the measurement; a button 618 which, when activated, causes the system to continue the test where it left off; a button 620 which, when selected, causes the system to skip the measurement, a button 622 which, when selected causes the system to skip the current test; and a button 616 which, when selected, causes the system to print the dialog window. A similar dialog box appears when the test program is stopped due to an error, except that the reason for stopping is that an error has been determined, and information relating to the error, such as "no value", "erroneous format", "divide by zero", "out of error limits", "DUT not responding", etc. are displayed.

It will be appreciated that the present invention thus provides the added benefit of being able to avoid unnecessary testing by allowing for the identification of errors or marginal results at any point during the testing and the further benefit of allowing a test to be stopped in the event that errors have occurred or potentially inferior devices are identified at any point in the testing, even if no failing results have been recorded.

A test program of the present invention will thus distinguish between errors and other types of results. By way of example, a simple test system with which the test program of the present invention may be used may consist of a voltmeter for measuring batteries. In such a test system, the system will typically automatically read the voltage from the voltmeter attached to the batteries and return voltage readings to the test program for comparison to specifications for that test. The specification for voltage may, by way of continuing example, be a reading of 9 Volts +/−1 Volt. Typically, if the battery (the DUT in this example) is functioning properly, a reading will be returned that is within the specification. An inferior DUT may lead to a result that is outside of the specification. However, a failure or mistake in the test system may lead to a result that is outside of the specification. By way of continuing example, if the power cord to the voltmeter under test is accidentally unplugged, the test program may receive no value from the voltmeter when it attempts to read a voltage. In such a case, the test program will register a timeout error when attempting to communicate with the voltmeter. In such a case, the test program of the present invention would record an "error" and would display the error on GUI 300 as described above. In particular, progress window 330 would display an error bar, tree structure in window 309 would display a "sad" face icon indicating an error, and window 340 would display a message string explaining the error. Likewise, in the case of an error, the features of Stop On icon 350 would allow testing to be stopped until the user has an opportunity to correct the mistake or failure of the test system that caused the error before proceeding with further testing. It will be appreciated by one of average skill in the art that, without the ability to distinguish errors from other results, the result recorded by the test program in the foregoing example would have been 0.0 volts, regardless of whether the DUT would have actually returned such a value. A result of 0.0 volts would have triggered a "failure" because 0.0 is outside the specification limits of 9 volts +/−1 volt. Without an error indication, there would be no means for the user to determine that a failure or mistake in the test system has occurred and caused the result of 0.0 volts, and the failure or mistake would go unchecked and continue to affect the remainder of the results obtained from the testing.

Figure 7:
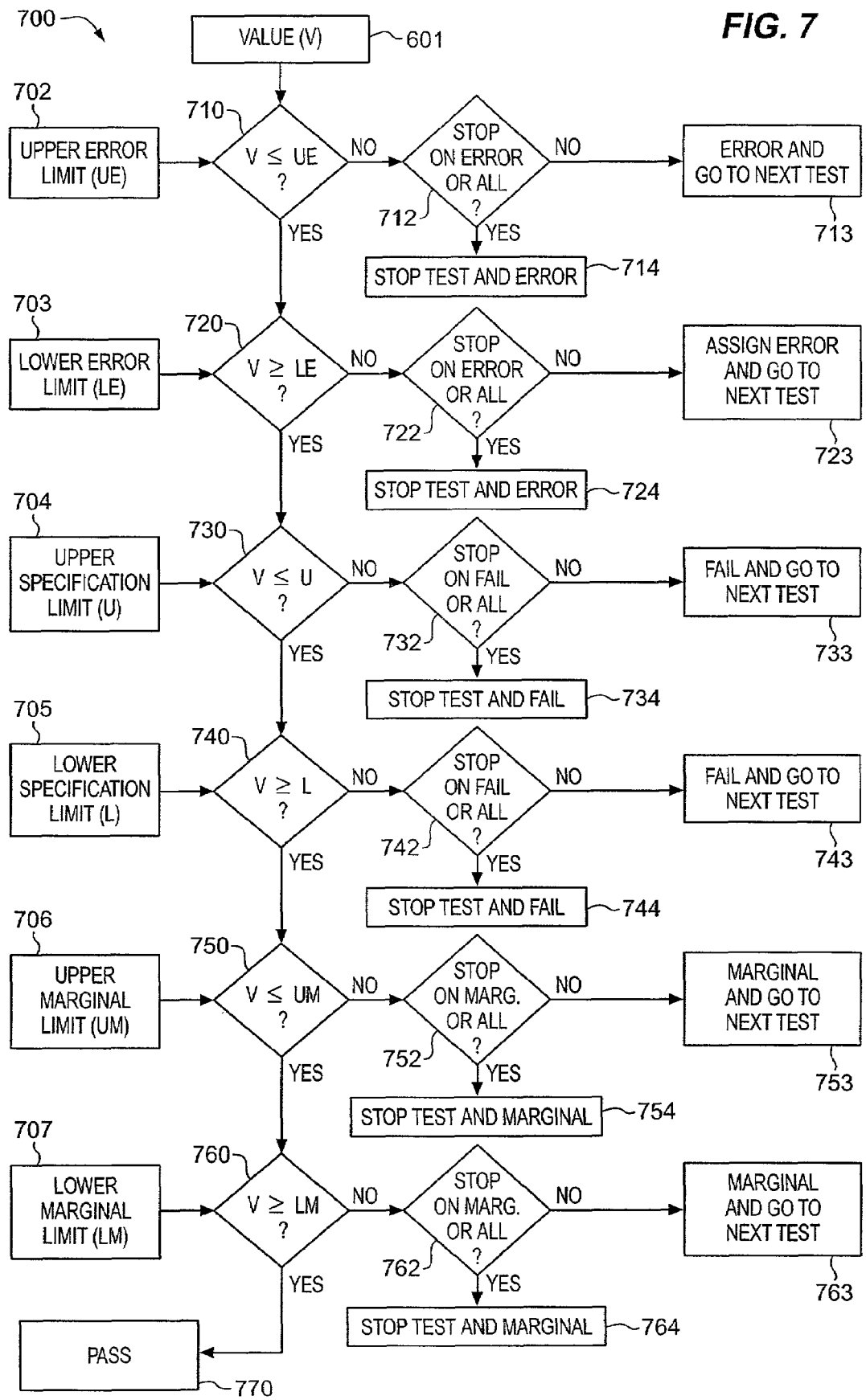
FIG. 7 shows a flow chart illustrating the determination of the pass, fail, marginal, or error status for each graphical element for a single-sided specification.

Referring to FIG. 7, there is shown a flow chart 700 illustrating the determination of the status of a result and whether to continue with the testing. The inputs used to determine the status include the value (V) 701 for the result, the upper error limit (UE) 702, the lower error limit (LE) 703, the upper specification limit (U) 704, the lower specification limit (L) 705, the upper marginal limit (UM) 706, and the lower marginal limit (LM) 707. The value (V), which is determined by the test measurement, and the limits U, L, UE, LE, UM, and LM, which are entered by the user, are stored in memory 101 (FIG. 1). In 710, test system 100 determines if V is less than or equal to UE. If it is, then test system 100 goes to 720. If it is not, then in 712 test system 100 determines if the "Error" button on Stop On icon 350 (FIG. 3) has been selected. If it has been selected, test system 100 assigns an error status to the result and stops the test process at 714. If it has not been selected, test system 100 assigns an error status to the result and proceeds to the next test at 713. In 720, test system 100 determines if V is greater than or equal to LE. If it is, then test system 100 goes to act 730. If it is not, then in 722 test system 100 determines if the "Error" button on Stop On icon 350 (FIG. 3) has been selected. If it has been selected, test system 100 assigns an error status to the result and stops the test process at 724. If it has not been selected, test system 100 assigns an error status to the result, and proceeds to the next test at 723. In 730, test system 100 determines if V is less than or equal to U. If it is, then test system 100 goes to 740. If it is not, then in 732 test system 100 determines if the "Fail" button on Stop On icon 350 (FIG. 3) has been selected. If it has been selected, test system 100 assigns a fail status to the result and stops the test process at 734. If it has not been selected, test system 100 assigns a fail status and proceeds to the next test at 733. In 740, test system 100 determines if V is greater than or equal to U. If it is, then test system 100 goes to 750. If it is not, then in 742 test system 100 determines if the "Fail" button on Stop On icon 350 (FIG. 3) has been selected. If it has been selected, test system 100 assigns a fail status to the result and stops the test process at 744. If it has not been selected, test system 100 assigns a fail status and proceeds to the next test at 743. In 750, test system 100 determines if V is less than or equal to UM. If it is, then test system 100 goes to 760. If it is not, then in 752 test system 100 determines if the "Marg" button on Stop On icon 350 (FIG.

3) has been selected. If it has been selected, test system 100 assigns a marginal status to the result and stops the test process at 754. If it has not been selected, test system 100 assigns a fail status and proceeds to the next test at 753. In 760, test system 100 determines if V is greater than or equal to LM. If it is, then test system 100 goes to 770 and assigns a pass status to the result. If it is not, then in 762 test system 100 determines if the "Marg" button on Stop On icon 350 (FIG. 3) has been selected. If it has been selected, test system 100 assigns a marginal status to the result and stops the test process at 764. If it has not been selected, test system 100 assigns a fail status and proceeds to the next test at 763.

It is thus a feature of the present invention to provide a test system with the ability to allow the user to distinguish erroneous results from marginal, pass and fail results. In particular, the present invention allows the user to distinguish important errors in the testing from other less important marginal results. The user is provided with the ability to program the present invention to alert the user to errors, marginal results, and failures, and to provide information regarding the error, marginal result, or failure when such result is encountered. The information and alerts are available on one window. The user may take immediate action as to whether to let the test progress or terminate the test and modify some of the parameters.

There has been described what at present is considered to be the preferred embodiment of the invention. It will be understood that the invention can be embodied in other specific forms without departing from its spirit or essential characteristics. For example, while the invention has been described in terms of an electronic test program, other systems may be implemented based on hardware instead of software. The program may, for instance, sit on a programmed processor or other platform. In addition, more than one progress window may be added to the graphical user interface to display the test results of two or more devices under test. The progress window may be displayed in other forms where the graphical elements may take a different form, such as a single alphanumeric element, or may be grouped in a different manner. The present embodiment is, therefore, to be considered as illustrative and not restrictive. The scope of the invention is indicated by the appended claims.

I claim:

1. A method of operating a test executive system for controlling tests on a device under test (DUT) that is separate and distinct from said test executive system, said method comprising:
    performing a measurement to obtain a test result;
    determining whether said test result is an erroneous result reflecting at least one of: faulty set up of said DUT and a failure of the interface between said test executive system, and any associated test equipment, and said DUT, as opposed to failures of said DUT itself; and
    displaying an error indication correlated to said measurement if said test result is-determined to be an erroneous result.

2. The method of claim 1 wherein said determining comprises determining whether said test result contains a value, and said displaying comprises displaying said error indication if said test result does not contain a value.

3. The method of claim 1 wherein said determining comprises determining whether said test result comprises a predetermined format, and said displaying comprises displaying said error indication if said test result does not comprise said predetermined format.

4. The method of claim 3 wherein said predetermined format comprises a format selected from the group consisting of: a numerical format, an alphanumeric format, and a string of numerical values and alphanumeric codes in a predetermined arrangement.

5. The method of claim 1 wherein said method further comprises storing a test specification, and said determining comprises determining whether said test result is within said test specification.

6. The method of claim 5 wherein said test specification comprises one or more limits.

7. The method of claim 6 wherein said one or more limits are selected from the group consisting of: error limits, specification limits, and marginal limits.

8. The method of claim 7 wherein said error limits comprise an upper error limit and a lower error limit, and said displaying comprises displaying said error indication if said test result is not within said upper error limit and said lower error limit.

9. The method of claim 7 wherein said specification limits comprise an upper specification limit and a lower specification limit, and said displaying comprises displaying a failed indication if said test result is not within said upper specification limit and said lower specification limit.

10. The method of claim 7 wherein said marginal limits comprise an upper marginal limit and a lower marginal limit, and said displaying comprises displaying a marginal indication if said test result is not within said upper marginal limit and said lower specification limit.

11. The method of claim 7 wherein said determining further comprises determining a pass result if said test result is within said upper marginal limit and said lower marginal limit, and said test result comprises said predetermined format.

12. The method of claim 1 wherein said displaying comprises displaying said error indication in a spreadsheet element corresponding to said measurement.

13. The method of claim 1 wherein said displaying comprises displaying said error indication as an icon in a hierarchical tree.

14. The method of claim 1 wherein said displaying comprises displaying said error indication in a progress window.

15. The method of claim 1 wherein said displaying comprises displaying information relating to said error.

16. The method of claim 15 wherein said displaying said information comprises displaying said information in a dialog box.

17. The method of claim 1 wherein said method further comprises:
    stopping said test after said act of determining;
    receiving an input selected from the group consisting of: abort said test, restart said test, restart said measurement, continue said test, skip said measurement, and skip said test; and
    executing said input.

18. The method as in claim 17 wherein said displaying comprises displaying information selected from the group consisting of: the results of the measurement on which the test program stopped, the reason for stopping the test, and the time at which the test stopped.

19. A test executive system for controlling electronic tests on a device under test (DUT) that is separate and distinct from said test executive system, said test executive system comprising:
    a memory for storing a test and test results including erroneous results reflecting at least one of: a faulty set up of said DUT and a failure of the interface between said test executive system, and any associated test equipment, and said DUT, as opposed to failures of said DUT itself;

an electronic processor communicating with said memory for controlling the execution of said test, generating said test results, and determining whether a test result is erroneous; and a graphical user interface output device communicating with said electronic processor for displaying information, said information including an error indicator indicative of an erroneous result.

20. A test executive system as in claim 19 wherein said memory also stores a DUT specification and a plurality of measurement datapoints, and wherein said test results also include failed results reflecting a comparison of said measurement datapoints with said test specification.

21. A test executive system as in claim 20 wherein said test result comprises an error result if, for a test datapoint, said result of said comparison contains no value, does not have a predetermined format, or is not within error limits.

22. A test executive system as in claim 19 wherein said information further includes a graphic element enabling a user to select among two or more of the following options: perform said test without stopping; stop said test on erroneous results; stop said test on failed results; stop said test on marginal results; stop said test on failed results or erroneous results; stop said test on marginal results, failed results or erroneous results; stop said test after each measurement.

23. A test executive system as in claim 22 wherein said information further includes a stop test indicator indicating which of said options has been selected.

24. A test executive system as in claim 19 wherein said error indicator comprises a graphical element selected from the group consisting of: a spreadsheet element corresponding to said measurement; an icon in a hierarchical tree; an error indication in a progress window; and a dialog box.

25. A product that provides a test executive system for controlling tests on a device under test (DUT) that is separate and distinct from said test executive system, said product comprising instructions for directing a processing unit to:

perform a measurement to obtain a test result;

determine whether said test result is an erroneous result reflecting at least one of: faulty set up of said DUT and a failure of the interface between said test executive system, and any associated test equipment, and said DUT, as opposed to failures of said DUT itself;

display an error indication correlated to said measurement if said result is determined to be an erroneous result; and a media readable by said processing unit that stores said instructions.

26. A product as in claim 25, and further including instructions to determine if said test result is a marginal result, and display a marginal result indication correlated to said measurement if said result is marginal.

27. A test executive system for controlling electronic tests on a device under test (DUT) that is separate and distinct from said test executive system, said test executive system comprising:

a memory for storing a test and test results;

an electronic processor communicating with said memory for controlling the execution of said test and generating said test results;

a graphical user interface device communicating with said electronic processor for displaying information, said information including a graphic element enabling a user to select among two or more of the following options: perform said test without stopping; stop said test on erroneous results; stop said test on failed results; stop said test on marginal results; stop said test on failed results or erroneous results; stop said test on marginal results, failed results or erroneous results; stop said test after each measurement; and a graphical input element selected from the group consisting of: abort said test, restart said test, restart said measurement, continue said test, skip said measurement, skip said test, and executing said input; and executing said input.

28. A test executive system as in claim 27 wherein said information further includes a stop test indicator indicating which of said options has been selected.

29. A test executive system as in claim 27 wherein said information further includes information selected from the group consisting of: the results of the measurement on which the test program has stopped; a reason for stopping a test; and the time at which a test stopped.

30. A method of operating a test executive system for controlling electronic tests on a device under test (DUT) that is separate and distinct from said test executive system, said method comprising:

performing a test to obtain a test result;

displaying information including a graphic element enabling a user to select among two or more of the following options: perform said test without stopping; stop said test on erroneous results; stop said test on failed results; stop said test on marginal results; stop said test on failed results or erroneous results; stop said test on marginal results, failed results or erroneous results; stop said test after each measurement;

receiving a selection of one of said options;

stopping said test as directed in said selected option;

after said act of stopping said test, displaying a graphical element enabling a user to select a command from the group consisting of: abort said test, restart said test, restart said measurement, continue said test, skip said measurement, and skip said test; and executing said command.

31. The method as in claim 30 wherein said method further comprises, after said act of stopping said test, displaying information selected from the group consisting of: the results of the measurement on which the test program stopped, the reason for stopping the test, and the time at which the test stopped.

32. A product that provides a test executive system for controlling tests on a device under test (DUT) that is separate and distinct from said test executive system, said product comprising instructions for directing a processing unit to:

perform a test to obtain a test result;

display information including a graphic element enabling a user to select among two or more of the following options: perform said test without stopping; stop said test on erroneous results; stop said test on failed results; stop said test on marginal results; stop said test on failed results or erroneous results; stop said test on marginal results, failed results or erroneous results; stop said test after each measurement;

receive a selection of one of said options; and stop said test as directed in said selected option; and a media readable by said processing unit that stores said instructions.

* * * * *